United States Patent
Mikami et al.

(10) Patent No.: US 11,171,032 B2
(45) Date of Patent: Nov. 9, 2021

(54) SEMICONDUCTOR CHIP PRODUCTION METHOD AND SURFACE PROTECTION TAPE

(71) Applicant: FURUKAWA ELECTRIC CO., LTD., Tokyo (JP)

(72) Inventors: Kazuki Mikami, Tokyo (JP); Tomoaki Uchiyama, Tokyo (JP); Akira Akutsu, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/738,158

(22) Filed: Jan. 9, 2020

(65) Prior Publication Data

US 2020/0144095 A1 May 7, 2020

Related U.S. Application Data

(63) Continuation of application No. PCT/JP2019/000313, filed on Jan. 9, 2019.

(30) Foreign Application Priority Data

Mar. 28, 2018 (JP) .............................. JP2018-062940

(51) Int. Cl.
*H01L 21/683* (2006.01)
*H01L 21/304* (2006.01)
(Continued)

(52) U.S. Cl.
CPC ............ *H01L 21/6836* (2013.01); *C09J 7/35* (2018.01); *C09J 133/08* (2013.01);
(Continued)

(58) Field of Classification Search
CPC ............... H01L 21/6836; H01L 21/304; H01L 21/3065; H01L 21/31058; H01L 21/78; H01L 21/268
See application file for complete search history.

(56) References Cited

U.S. PATENT DOCUMENTS

2011/0010908 A1* 1/2011 George ................. B32B 43/006
29/426.2
2013/0029137 A1 1/2013 Eto et al.
2018/0012788 A1 1/2018 Oka et al.

FOREIGN PATENT DOCUMENTS

JP 2006152154 A 6/2006
JP 2007-19385 A 1/2007
(Continued)

OTHER PUBLICATIONS

Notice of Reasons for Refusal issued in Japanese Patent Application No. 2018-062940 dated Sep. 28, 2020.
(Continued)

*Primary Examiner* — Seahvosh Nikmanesh
(74) *Attorney, Agent, or Firm* — Marshall, Gerstein & Borun LLP

(57) ABSTRACT

After grinding is performed on a semiconductor wafer, the semiconductor wafer is fixed on the electrostatic chuck so as to cause the front surface side of the semiconductor wafer to face the electrostatic chuck. Next, a masking material layer is formed on the rear surface of the ground semiconductor wafer in a state where a surface protection tape is bonded thereto. Then, a masking tape is cut by irradiating, from the rear surface side, portions thereof corresponding to a plurality of streets appropriately formed in a grid shape in a pattern surface with a laser beam so as to form openings for the streets in the semiconductor wafer. Then, $SF_6$ plasma irradiation is performed from the rear surface side so as to etch the semiconductor wafer that has been exposed in the street portions. Finally, ashing is performed using $O_2$ plasma.

9 Claims, 7 Drawing Sheets

(51) Int. Cl.
*H01L 21/3065* (2006.01)
*H01L 21/3105* (2006.01)
*H01L 21/78* (2006.01)
*H01L 21/268* (2006.01)
*C09J 7/35* (2018.01)
*C09J 133/08* (2006.01)

(52) U.S. Cl.
CPC ........ *H01L 21/304* (2013.01); *H01L 21/3065* (2013.01); *H01L 21/31058* (2013.01); *H01L 21/78* (2013.01); *H01L 21/268* (2013.01); *H01L 2221/68327* (2013.01); *H01L 2221/68381* (2013.01)

(56) References Cited

FOREIGN PATENT DOCUMENTS

| | | |
|---|---|---|
| JP | 2012-212731 A | 11/2012 |
| JP | 2013-23665 A | 2/2013 |
| JP | 2016-164972 A | 9/2016 |
| JP | 2016-171261 A | 9/2016 |
| JP | 2017-63210 A | 3/2017 |
| KR | 10-2016-0125524 A | 10/2016 |
| WO | WO-2015/146856 A1 | 10/2015 |
| WO | WO-2018/043391 A1 | 3/2018 |

OTHER PUBLICATIONS

International Search Report issued in PCT Patent Application No. PCT/JP2019/000313 dated Apr. 9, 2019.
Office Action issued in Korean Patent Application No. 10-2019-7027213 dated Dec. 25, 2020.
Notification of Examination Opinion issued in Taiwanese Patent Application No. 10810376 dated Feb. 4, 2020.
Declaration of Rejections issued in Taiwanese Patent Application No. 108101376 dated Jul. 1, 2020.
Notice of Reasons for Refusal issued in Japanese Patent Application No. 2018-062940 dated Apr. 26, 2021.
Office Action issued in Korean Patent Application No. 10-2019-7027213 dated Aug. 7, 2021.

* cited by examiner

SEMICONDUCTOR CHIP PRODUCTION METHOD AND SURFACE PROTECTION TAPE

TECHNICAL FIELD

The present invention relates to a method for producing semiconductor chips by separating a semiconductor wafer using plasma dicing, and a surface protection tape for a semiconductor wafer used in the method.

BACKGROUND

In recent years, considerable progress has been made in thinning and downsizing of semiconductor chips. In particular, IC cards including semiconductor IC chips, such as a memory card and a smart card, require thinning of the chips, and LED/LCD drive devices or the like require downsizing of the chips. With increase in demands for these products, it is considered that there will be even more needs for thinning and downsizing of semiconductor chips in the future.

These semiconductor chips are obtained by reducing a thickness of a semiconductor wafer to a predetermined thickness through processes such as back grinding and etching and then divided into individual chips through a dicing process. In such a dicing process, a blade-dicing method in which a dicing blade is used to cut the wafer has been in use. In the blade-dicing method, cutting resistance from the blade is directly applied to the semiconductor wafer at the time of cutting. Thus, this cutting resistance may cause the semiconductor chip to have a micro chipping. The occurrence of the chipping not only impairs appearance of the semiconductor chip but also may invite chip breakage at the time of pickup due to insufficient transverse strength in some cases and may possibly damage circuit patterns on the chip. Also, in the dicing process of physically dicing with a blade, it is impossible to decrease a width of a kerf (also called as a scribe line or a street), which is a space between two chips, less than a blade width having a thickness. As a result, the number of chips that can be obtained from a wafer (an yield) is small. Furthermore, long processing time of the wafer has also been an issue.

Other than the blade-dicing method, various methods have been used as the dicing process. For example, in view of difficulty in dicing after thinning a wafer, there is a DBG (dicing before grinding) method, in which grooves of a predetermined depth are formed in the wafer in advance and then grinding process is performed thereto so that thinning the chip and dividing the chip into individual pieces are performed simultaneously. In this method, although the kerf width is the same as in the blade-dicing process, the transverse strength of the chip is improved and breakage of the chip can be prevented.

Also, there is a laser dicing method in which dicing is performed by a laser. The laser dicing method can make the kerf width smaller and also has an advantage that the process can be a dry process. However, there is an inconvenience that the wafer surface may be contaminated with a sublimate from the laser cutting, and thus a pretreatment for protecting the wafer surface using a predetermined liquid protection material may be required in some cases. Also, although it is called as a dry process, a complete dry process has not been achieved yet. Furthermore, the process speed can be faster in the laser dicing method than in the blade-dicing method. However, line-by-line processing remains the same, and manufacturing of microchips still requires a certain amount of time.

Also, there are methods using wet process such as a water jet method in which dicing is performed using water pressure. This method may cause a problem for materials such as a MEMS device or CMOS sensor in which prevention of surface contamination is highly essential. Also, there is a limit in reducing of the kerf width, and the yield of the obtained chip may be low.

Also, there has been a stealth dicing method in which a modifying layer is formed in a thickness direction of the wafer by using a laser and the wafer is expanded to fracture for separation. This method has an advantage that the kerf width can be zero with a dry process. However, the transverse strength of the chip may tend to decrease due to thermal history during formation of the modifying layer, and also there may be silicon debris generated at the time of expansion and separation. Furthermore, collision between neighboring chips may lead to insufficiency in the transverse strength.

Furthermore, as a method that combines the stealth dicing and the DBG, there is a chip dicing method for narrow scribe width in which a modifying layer is formed for a predetermined thickness before thinning and then grinding process is performed onto the rear surface thereof so as to perform thinning and separating of the chip at the same time. With this technique, the disadvantages of the above processes are improved. The silicon modifying layer cleaves due to stress force during the grinding process of the rear surface of the wafer so as to separate the wafer into dies and this leads to advantages such as zero kerf width, high yield of the chip, and enhanced transverse strength. However, since the wafer is separated during the grinding process of the rear surface, there may be, in some cases, a phenomenon in which neighboring chip end faces collide with each other, causing chipping off of corners of the chips.

Also, a dicing technology using plasma dicing method has been proposed (see Japanese Unexamined Patent Application Publication No. 2007-19385 (JP-A-2007-19385), for example). The plasma dicing method divides the semiconductor wafer by plasma, which selectively etches regions that are not masked. This dicing method enables to separate chips selectively and allows the separation without any problems even if the scribe line is not straight. Also, since its etching rate is extremely high, the plasma dicing method has been considered as one of the most suitable processes for dividing chips in recent years.

In the plasma dicing method, fluorine gas such as sulfur hexafluoride ($SF_6$) or carbon tetrafluoride ($CF_4$) having an extremely high reactivity with the wafer is used as a plasma generating gas. Thus, the etching rate is high and a mask must protect areas that are not to be etched.

This mask is formed on the pattern surface side of the semiconductor wafer and removed in an ashing process using $O_2$ plasma after the wafer is separated into chips through the plasma process. However, because the mask is not always formed as a uniform layer, there has been a concern that excessive ashing trying to remove the mask completely may damage the device.

SUMMARY OF THE DISCLOSURE

The present invention was made in view of such problems. Its object is to provide a method for producing semiconductor chips, in which damages to a device during ashing of a mask can be suppressed while dividing and separating a wafer by plasma dicing, and the like.

To achieve the above object, a first invention is a method for producing semiconductor chips. The method includes a step a of grinding a rear surface of a semiconductor wafer wherein the semiconductor wafer includes a pattern surface on which a surface protection tape is pasted, the surface protection tape includes at least a substrate film and a temporary adhesive layer, and the rear surface is ground with a surface protection tape being pasted; a step b of forming a mask material layer on the rear surface of the semiconductor wafer after the rear surface is ground with the surface protection tape being pasted; a step c of cutting parts that correspond to streets of the semiconductor wafer to open the streets from a side of the mask material layer of the semiconductor wafer; a step d of plasma dicing in which $SF_6$ plasma divides and separates the semiconductor wafer at the streets into individual semiconductor chips; a step e of ashing in which $O_2$ plasma removes the mask material layer; a step f of pasting a chip fixing tape to the rear surface of the semiconductor wafer after ashing, and fixing the semiconductor wafer to a ring frame to be supported; and a step g of releasing the surface protection tape.

It is preferable that the temporary adhesive layer includes (meth) acrylic copolymer, which has an ethylenically unsaturated bond in a side chain as a principal component, and a content rate of the (meth) acrylic copolymer and cross-linked substances of the (meth) acrylic copolymer is 90% or more.

It is preferable that, in the temporary adhesive layer, 0.5-5.0 pts·mass of a curing agent including an isocyanate group or epoxy group is used for 100 pts·mass of (meth) acrylic copolymer, and at least a part of the curing agent is cross liked.

It is preferable that a bending elastic modulus of the substrate film is between $5.0 \times 10^8$ Pa and $1.0 \times 10^{10}$ Pa.

It is preferable that a melting point of a resin forming the substrate film is 90° C. or higher.

It is preferable that a surface roughness Ra of a surface of the substrate film where the temporary adhesive layer is not formed is between 0.1 μm and 2.0 μm.

It is preferable that a surface resistivity of the surface of the substrate film where the temporary adhesive layer is not formed is less than $10^{13}$ Ω/sq.

It is preferable that a storage elastic modulus of the temporary adhesive layer is between $5.0 \times 10^4$ Pa and $2.0 \times 10^5$ Pa.

According to the first invention, a wafer can be separated into chips by plasma irradiation, and thus production of defective chips can be prevented. At this time, after a surface protection tape is pasted on a pattern surface side, a mask material layer is formed on a rear surface side of the semiconductor wafer and then the semiconductor wafer is separated from the rear surface side of the semiconductor wafer. For this reason, the pattern surface is not damaged in an ashing process that is performed to remove the mask material layer. That is, it is possible to prevent a device from being damaged during ashing of the mask.

Also, if the temporary adhesive layer includes (meth) acrylic copolymer, which has an ethylenically unsaturated bond in a side chain as a principal component, and a content rate of the (meth) acrylic copolymer and cross-linked substances of the (meth) acrylic copolymer is 90% or more, the chemical resistance or oxidizing resistance of the temporary adhesive layer is sufficient and thus melting or swelling of the temporary adhesive layer can be suppressed.

Also, the temporary adhesive layer is cross linked by a curing agent that includes a predetermined amount of isocyanate group or epoxy group to (meth) acrylic copolymer. This can ensure followability of the temporary adhesive layer to the pattern surface of the wafer and it is possible to suppress wafer cracking at the time of grinding of the rear surface of the wafer or the like.

Also, the bending elastic modulus of the substrate film is between $5.0 \times 10^8$ Pa and $1.0 \times 10^{10}$ Pa, and this can suppress wafer warping, which improves handling property.

Also, the melting point of the resin forming the substrate film is 90° C. or higher, and this can prevent the surface protection film from melting when the wafer is irradiated by plasma from the rear surface side.

Also, if the surface roughness Ra of a surface of the substrate film where the temporary adhesive layer is not formed is between 0.1 μm and 2.0 μm, the electrostatic chuck can hold the wafer with more certainty.

Also, similarly to the above, if the surface resistivity of the surface of the substrate film where the temporary adhesive layer is not formed is less than $10^{13}$ Ω/sq, the electrostatic chuck can hold the wafer with more certainty.

Also, if the storage elastic modulus of the temporary adhesive layer is between $5.0 \times 10^4$ Pa and $2.0 \times 10^5$ Pa, wafer cracking or the like in the production process can be suppressed.

A second invention is a surface protection tape that is used in the method for producing semiconductor chips according to the first invention.

According to the second invention, it is possible to produce semiconductor chips efficiently.

The present invention can provide a method for producing semiconductor chips, in which damages to a device during ashing of a mask can be suppressed while dividing and separating a wafer by plasma dicing, and the like.

DETAILED DESCRIPTION

Figure 1A:
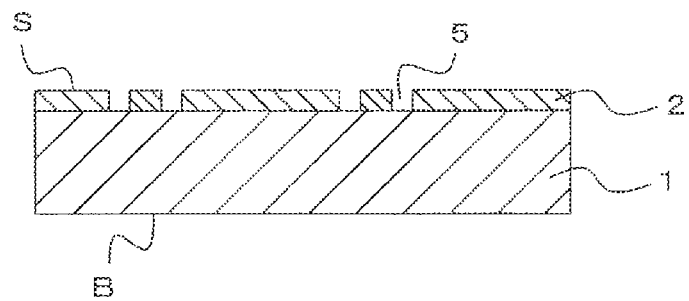
FIG. 1A is a schematic cross sectional view showing a semiconductor wafer 1 in one of steps up to pasting of a surface protection tape 3 onto the semiconductor wafer 1.

Hereinafter, some embodiments of the present invention will be described with reference to the accompanying drawings. However, apart from those specified in the present invention, the present invention is not limited to the embodiments described below. Also, embodiments in the drawings are schematically illustrated for ease of understanding the present invention: some of the sizes, thicknesses, or magnitude correlations may have been altered for the convenience of description and does not show the real correlations. The outer forms and shapes of the present invention are also not limited to those illustrated in these drawings except for the matters specified in the present invention.

Also, unless otherwise specifically noted, any commonly used devices and materials that have been conventionally used in semiconductor wafer process can be used as the devices and materials to be used in the embodiments below, and conditions for use thereof can be suitably determined and optimized according to a purpose thereof within a scope of common usage. Also, any redundant descriptions on materials, structures, methods, effects, and so forth that are common among the embodiments will be omitted.

Figure 1B:
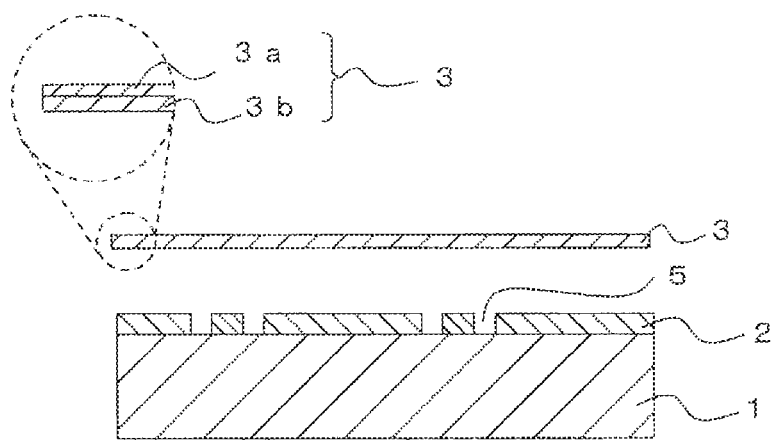
FIG. 1B is a schematic cross sectional view showing a state of pasting of the surface protection tape 3 onto the semiconductor wafer 1 in one of the steps up to pasting of the surface protection tape 3 onto the semiconductor wafer 1.
Figure 1:
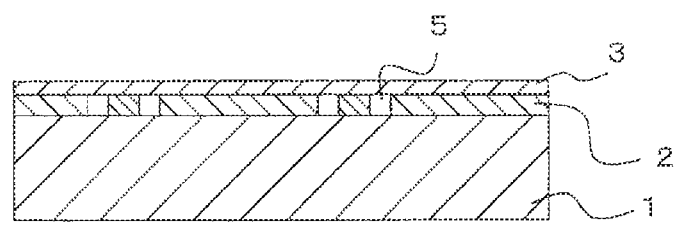
FIG. 1C is a schematic cross sectional view showing the semiconductor wafer 1 pasted with the surface protection tape 3 in one of the steps up to pasting of a surface protection tape 3 onto the semiconductor wafer 1.
Figure 2:
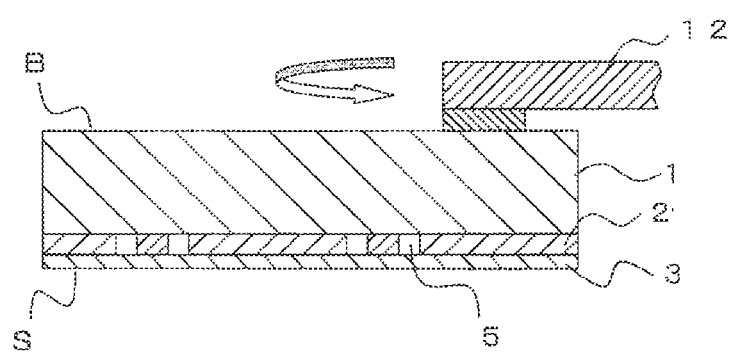
FIG. 2A is a schematic cross sectional view showing a thinning process of the semiconductor wafer 1 in one of steps up to thinning and fixing of the semiconductor wafer 1.
FIG. 2B is a schematic cross sectional view showing a state of disposing the semiconductor wafer 1 onto an electrostatic chuck 9 in one of the steps up to thinning and fixing of the semiconductor wafer 1.
FIG. 2C is a schematic cross sectional view showing a state of the semiconductor wafer 1 being fixed onto the electrostatic chuck 9 in one of the steps up to thinning and fixing of the semiconductor wafer 1.
Figure 2:
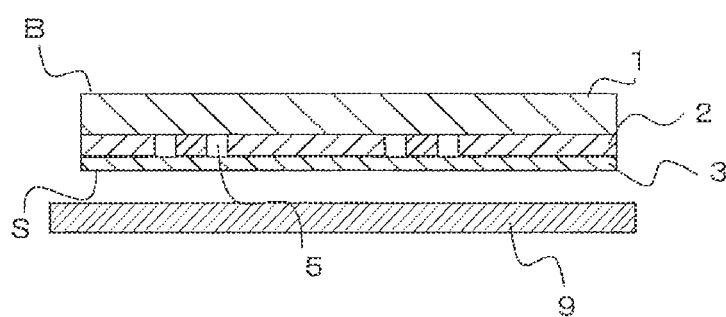
Figure 2:
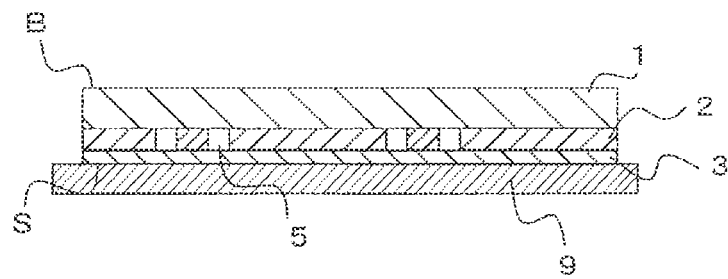
Figure 3:
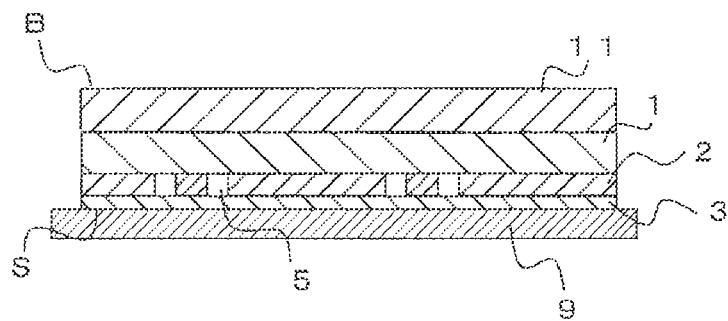
FIG. 3A is a schematic cross sectional view showing a state in which a masking tape 11 is pasted in one of steps up to mask formation.
FIG. 3B is a schematic cross sectional view showing a step of cutting and removing a portion of the masking tape 11 that corresponds to a street by using a laser L in one of steps up to mask formation.
Figure 3:
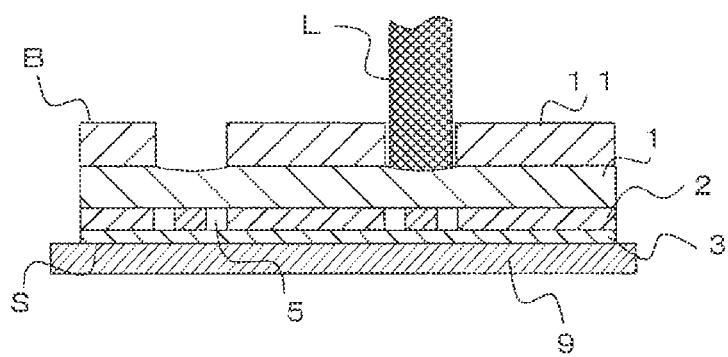
Figure 4:
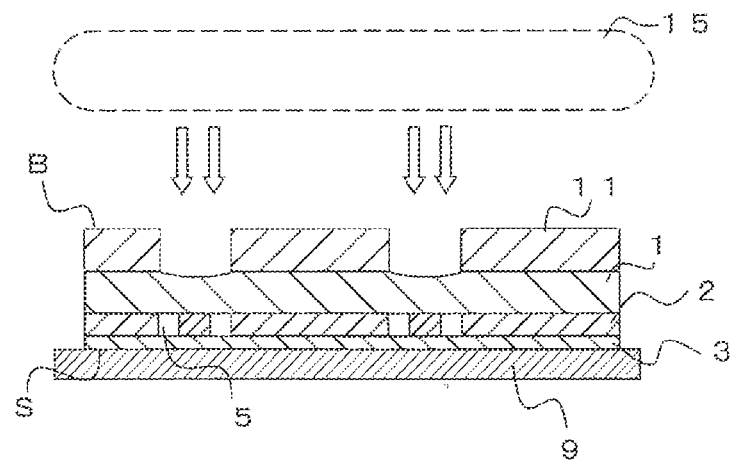
FIG. 4A is a schematic cross sectional view illustrating a state of plasma dicing in one of plasma dicing steps.
FIG. 4B is a schematic cross sectional view illustrating a state in which chips 7 are separated in one of the plasma dicing steps.
Figure 4:
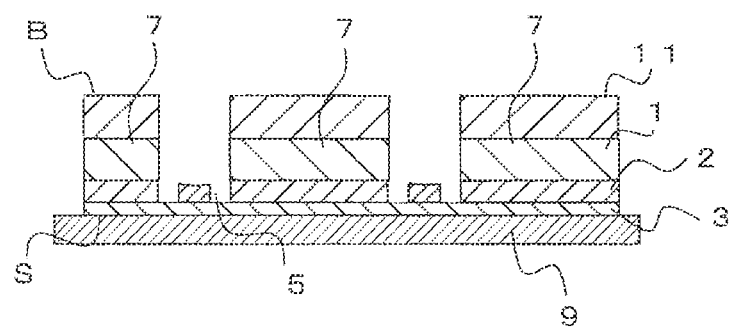

A method for producing according to the present invention will be described with reference to FIG. 1A to FIG. 7B. As shown in FIG. 1A, a semiconductor wafer 1 is a silicon wafer or the like that includes a pattern surface 2 on a front surface S thereof where a semiconductor element circuit or the like is formed. The pattern surface 2 is a surface on which the semiconductor element circuit and the like are formed and includes a street 5 in a plane view. First, as shown in FIG. 1B, a surface protection tape 3 is pasted on a side of the pattern surface 2 of the semiconductor wafer 1. Accordingly, the semiconductor wafer 1 having the pattern surface 2 covered with the surface protection tape 3 is obtained as shown in FIG. 10.

The surface protection tape 3 includes at least a temporary adhesive layer 3b on a substrate film 3a. The surface protection tape 3 may also include other layers. Also, in the surface protection tape 3, the substrate film 3a and the temporary adhesive layer 3b may be in a single-layered structure or in double or more layered structure, respectively. The surface protection tape 3 will be described in detail below.

Next, as shown in FIG. 2A, with the surface protection tape 3 being pasted, a wafer grinding device 12 grinds a rear surface B of the semiconductor wafer 1 to make a thickness of the semiconductor wafer 1 thinner. After grinding the semiconductor wafer 1, as shown in FIG. 2B, a side of the surface protection tape 3 of the semiconductor wafer 1 (a side of the front surface S) is made to face an electrostatic chuck 9 and the semiconductor wafer 1 is then fixed to the electrostatic chuck 9. That is, as shown in FIG. 2C, the electrostatic chuck 9 is in close contact with the surface protection tape 3 (the front surface S). Alternatively, instead of using the electrostatic chuck 9, the semiconductor wafer 1 may be fixed by other methods as long as the surface protection tape 3 of the semiconductor wafer 1 can be fixed.

Next, as shown in FIG. 3A, with the surface protection tape 3 being pasted, a mask material layer is formed on the ground rear surface B of the semiconductor wafer 1. The mask material layer is formed by, for example, pasting a masking tape 11 or applying a resin using a spin coater or the like. In the present embodiment, an example in which the masking tape 11 is pasted to form the mask material layer will be described.

Next, as shown in FIG. 3B, from a side of the masking tape 11 (the rear surface B), a laser L is irradiated onto a plurality of streets 5 that are formed suitably on the pattern surface 2 in lattice forms or the like that correspond to a plurality of the streets 5 to cut the masking tape 11 and make openings for the portions that correspond to the streets 5 of the semiconductor wafer 1. As for the laser for cutting the masking tape 11, a laser irradiation device that irradiates laser beams of ultraviolet or infrared rays can be used. This laser irradiation device has laser irradiation parts that are arranged so as to be able to move along the streets 5 of the semiconductor wafer 1 and can irradiate the laser L of which output power is suitably controlled for removing the masking tape 11. Although the laser L is not limited in particular, $CO_2$ laser or YAG laser are applicable. Among others, $CO_2$ laser is capable of outputting high power of a several to several tens Watt and thus can be suitably used in the present invention.

Next, as shown in FIG. 4A, from the side of the masking tape 11 (the rear surface B), $SF_6$ gas plasma 15 is irradiated to etch the semiconductor wafer 1 that is exposed at the parts corresponding to streets 5. The irradiation of the $SF_6$ gas plasma 15 can divide the semiconductor wafer 1 into separated semiconductor chips 7 as shown in FIG. 4B (a plasma dicing process).

To perform plasma dicing, a plasma etching device can be used. The plasma etching device is a device capable of dry etching the semiconductor wafer 1, having a closed processing space provided inside a vacuum chamber in which the semiconductor wafer 1 is mounted on a high-frequency side electrode and the plasma generating gas is supplied from a gas supplying electrode that is provided opposite to the high-frequency side electrode. Plasma is generated between the gas supplying electrode and the high-frequency side electrode when high frequency voltage is applied onto the high-frequency side electrode and this plasma is used. A refrigerant is circulated inside the high-frequency electrode, which generates heat, to prevent temperature rising of the semiconductor wafer 1 due to plasma heat.

Figure 5A:
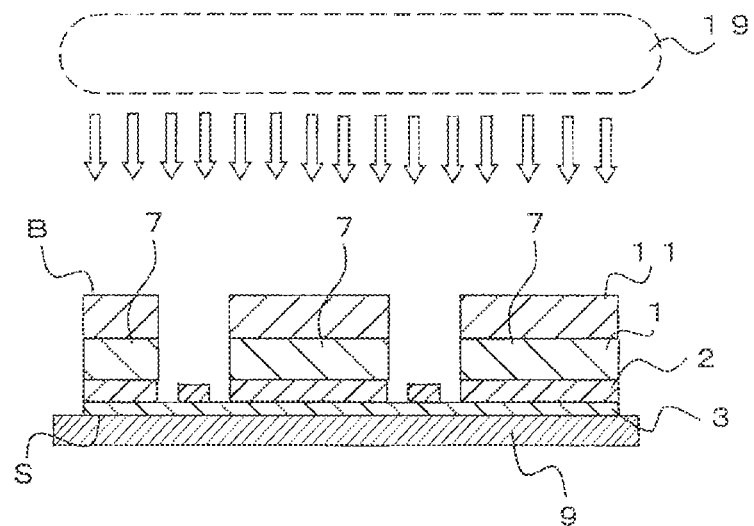
FIG. 5A is a schematic cross sectional view illustrating a state of ashing in one of ashing steps.
Figure 5B:
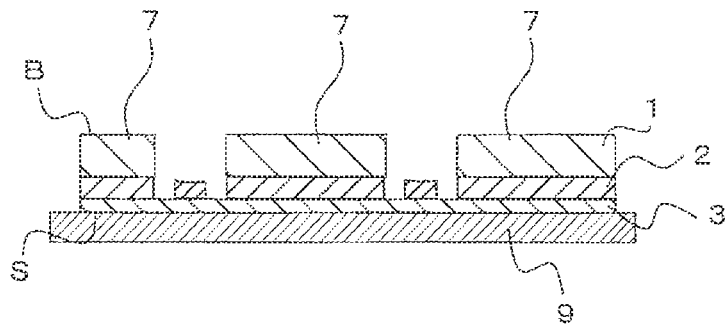
FIG. 5B is a schematic cross sectional view illustrating a state in which the masking tape 11 is removed in one of the ashing steps.

Next, as shown in FIG. 5A, ashing is performed by $O_2$ plasma 19 (an ashing process). Ashing by $O_2$ plasma 19 can remove the masking tape 11 remaining on the rear surface B as shown in FIG. 5B.

Here, this etching process of a silicon semiconductor wafer using $SF_6$ gas is also called as Bosch process. In this process, the exposed silicon Si is reacted with fluorine atom F generated from $SF_6$ by plasma to form silicon fluoride ($SiF_4$), which is then removed. The process is also called as reactive ion etching (RIE). On the other hand, removal of a mask material layer using $O_2$ gas is a method, which is also used as a plasma cleaner in the semiconductor manufacturing process, called as ashing (converting into ashes) and is one of techniques to remove organic substances. This is for cleaning organic residue remaining on a surface of the semiconductor device.

Figure 6A:
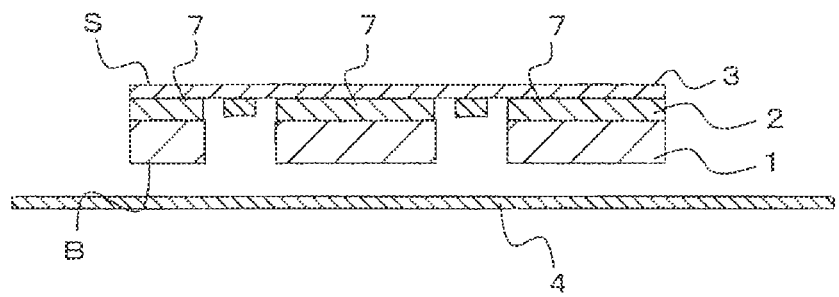
FIG. 6A is a schematic cross sectional view illustrating a state in which the chip 7 is pasted with a chip fixing tape 4 in one of steps of fixing the chip 7 onto the chip fixing tape 4.
Figure 6:
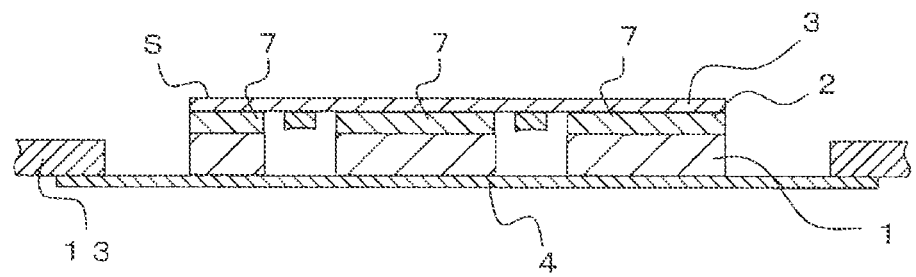
FIG. 6B is a schematic cross sectional view illustrating a state in which the chip 7 is fixed to the chip fixing tape 4 in one of the steps of fixing the chip 7 onto the chip fixing tape 4.
FIG. 6C is a schematic cross sectional view illustrating a state in which the surface protection tape 3 is released in one of the steps of fixing the chip 7 onto the chip fixing tape 4.
Figure 6:
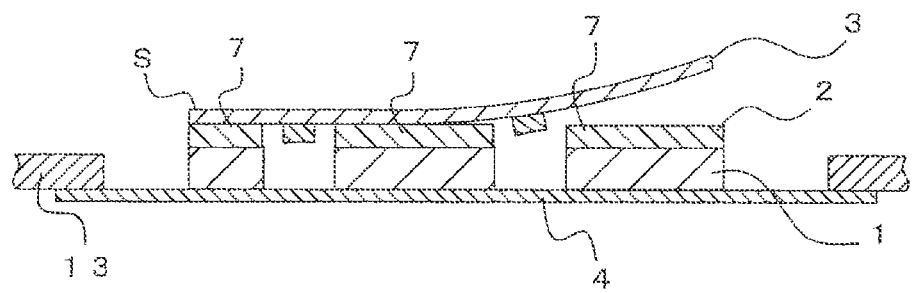
Figure 7:
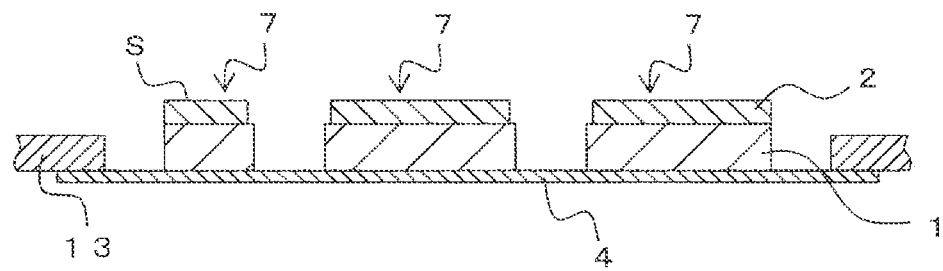
FIG. 7A is a schematic cross sectional view illustrating a state in which the surface protection tape 3 is removed in one of steps of picking up the chip 7.
FIG. 7B is a schematic cross sectional view illustrating a state in which the chip 7 is picked up in one of the steps of picking up the chip 7.
Figure 7:
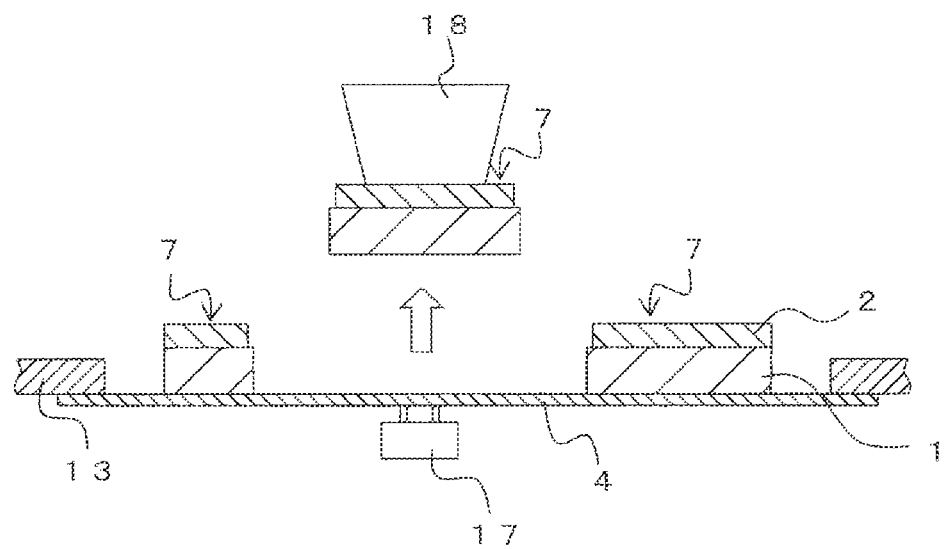

Next, as shown in FIG. 6A, the semiconductor wafer 1 with the surface protection tape 3 being pasted after ashing is detached from the electrostatic chuck 9, and then a chip fixing tape 4 is pasted onto the side of the rear surface B. Also, as shown in FIG. 6B, the semiconductor wafer 1 (the chips 7) is fixed to and supported by the ring frame 13.

Next, as shown in FIG. 6C, the surface protection tape 3 is released from the semiconductor wafer 1. To release the surface protection tape 3, a releasing tape or the like is used, for example. At this time, an adhesive force between the chip 7 and the chip fixing tape 4 is stronger than an adhesive force between the surface protection tape 3 and the chip 7 so that the surface protection tape 3 can be easily released. Before releasing the surface protection tape 3, ultraviolet rays may be irradiated onto the surface protection tape 3 to cure the temporary adhesive layer 3b and weaken the adhesive force.

FIG. 7A is a view showing a state in which the surface protection tape 3 is removed and the chips 7 being fixed to the chip fixing tape 4 and the ring frame 13 are exposed. From this state, a pin 17 pushes up the separated individual chip 7, and a collet 18 sticks to and picks up the chip 7. Accordingly, a semiconductor chip can be manufactured. After this, the picked up chip 7 is transferred to a die bonding process.

Next, various types of tapes that are used in the production method of the present invention will be described.

(Surface Protection Tape 3)

As described above, the surface protection tape 3 includes the temporary adhesive layer 3b provided on the substrate film 3a and serves as a protector for the semiconductor elements formed on the pattern surface 2. That is, since the surface protection tape 3 supports the semiconductor wafer 1 at the pattern surface 2 when the rear surface of the wafer is ground in the above-mentioned wafer thinning process, the surface protection tape 3 is required to be capable of withstanding this grinding load. Thus, unlike a simple photoresist film or similar, the surface protection tape 3 has an enough thickness to coat the elements formed on the pattern surface 2, a low pressing resistance, and high adhesion so as to be adhered with the elements as closely as possible to protect infiltration of dust and grinding water during grinding.

(Substrate Film 3a)

The substrate film 3a of the surface protection tape 3 is made of material such as plastic or rubber, which can be suitably selected according to the required characteristics from groups of a homopolymer or copolymer of α-olefin such as polyethylene, polypropylene, ethylene-propylene copolymer, polybutane-1, poly-4-methyl pentene-1, ethylene-vinyl acetate copolymer, ethylene-acrylic acid copolymer and an ionomer; a mixture of the above; a simple substance or a mixture of two or more substances of polyethylene terephthalate, polyethylene naphthalate, polyphenylene sulfide, polyether imide, polyimide, polycarbonate, polymethyl methacrylate, polyurethane, stylene-ethylene-butene, pentene copolymer, or the like; and a resin composition of the above added with other resin, fillers, additives, or the like. A laminate of low-density polyethylene and ethylene-vinyl acetate copolymer, a laminate of polypropylene and polyethylene terephthalate, polyethylene terephthalate, or polyethylene naphthalate is one of the suitable materials.

The substrate film 3a of such materials can be manufactured by using a common extrusion method. If the substrate film 3a is obtained by laminating various resins, a co-extrusion method, a lamination method, or the like can be used. At this time, an adhesive layer may be provided between resins as commonly done in a generally used manufacturing method of a lamination film. A thickness of such the substrate film 3a is preferably between 20 μm and 200 μm in view of strength, expansion property or the like, and radiotransparency.

A bending elastic modulus of the substrate film 3a is preferably between $5.0 \times 10^8$ Pa and $1.0 \times 10^{10}$ Pa. If the bending elastic modulus of the substrate film 3a is less than $5.0 \times 10^8$ Pa, a warp reforming force for the semiconductor wafer 1 is lost, which may cause a conveyance error. On the other hand, if the bending elastic modulus of the substrate film 3a is over $1.0 \times 10^{10}$ Pa, the semiconductor wafer 1 may break because the releasing force is added onto the semiconductor wafer 1 at the time of releasing the surface protection tape 3.

Also, a melting point of the resin forming the substrate film 3a is preferably 90° C. or higher. This is because, if the melting point is lower than 90° C., there is a possibility that a surface of the substrate film 3a may soften due to heat generated in the semiconductor wafer 1 during the plasma dicing process.

Also, a surface roughness Ra of a surface of the substrate film 3a where the temporary adhesive layer 3b is not formed is preferably between 0.1 μm and 2.0 μm. The surface roughness of 0.1 μm is substantially the limit value that can be adjusted in the manufacture. Also, if the surface roughness is over 2.0 μm, a chuck error in the electrostatic chuck 9 is likely to occur and may cause a conveyance error.

Also, a surface resistivity of the surface of the substrate film 3a where the temporary adhesive layer 3b is not formed is preferably less than $10^{13}$ Ω/sq. If the surface resistivity is $10^{13}$ Ω/sq or more, it becomes difficult for the electrostatic chuck 9 to adhere to the semiconductor wafer 1 and this may cause a chuck error.

(Temporary Adhesive Layer 3b)

The temporary adhesive layer 3b should not damage the semiconductor elements and the like when being pasted onto the pattern surface 2. Also, the temporary adhesive layer 3b should not damage the semiconductor elements and the like nor leave residue of temporary adhesive agent on the surface when being removed. To achieve this, for the temporary adhesive layer 3b, a temporary adhesive agent such as non-curing adhesive having such properties can be used. More preferably, a radiation polymerizable type adhesive agent such as ultraviolet curable type or an ionizing radiation curable type cured by electron beams can be used. In the radiation polymerizable type, the temporary adhesive agent is formed into a three-dimensional network structure by irradiating radioactive rays, or more preferably ultraviolet rays, so that the temporary adhesive force is impaired and the temporary adhesive agent hardly leaves any residue on the surface when removed. In this description, 'radioactive ray' is used to mean both rays of light, such as ultraviolet rays, and ionizing radiation, such as electron beams. Ultraviolet rays are the preferable radioactive rays to be used in the present invention.

If the temporary adhesive layer 3a is formed of radiation curable temporary adhesive, a temporary adhesive including acrylic temporary adhesive and radiation polymerizable compound can be suitably used. The acrylic temporary adhesive includes (meth) acrylic copolymer and a curing agent as components. Examples of the (meth) acrylic copolymer are a copolymer including (meth) acrylic acid ester as a constituting unit, (meth) acrylic polymer of (meth) acrylic acid ester copolymer, or a copolymer with functional monomer, mixtures of these polymers, and the like. As for the molecular weight of these polymers, polymers of high molecular weight having mass-average molecular weight of 500,000 to 1,000,000 are generally applied.

The curing agent reacts with the functional group in (meth) acrylic copolymer and is used for adjusting temporary adhesive force and cohesive force. Examples of the curing agent are: an epoxy compound having two or more epoxy groups in a molecule such as 1,3-Bis(N,N-diglycidyl aminomethyl)cyclohexane, 1,3-Bis(N,N-diglycidyl aminomethyl)toluene, 1,3-Bis(N,N-diglycidyl aminomethyl)benzene, or N,N,N,N'-tetraglycidyl-m-xylenediamine; an isocyanate compound having two or more isocyanate groups in a molecule such as 2,4-tolylene diisocyanate, 2,6-tolylene diisocyanate, 1,3-xylene diisocyanate, 1,4-xylene diisocyanate, or diphenyl-methane-4,4'-diisocyanate; and an aziridine compound having two or more aziridine functional groups in a molecule such as tetramethylol-tri-β-aziridinyl propionate, trimethylol-tri-β-aziridinyl propionate, or trimethylolpropane-tri-β-(2-methylaziridine) propionate. Amount of the curing agent to be added may be adjusted according to the required temporary adhesive force: 0.1-5.0 pts·mass of the curing agent for 100 pts·mass of (meth) acrylic copolymer is suitable. In the temporary adhesive layer 3a of the surface protection tape 3 used in the present invention, the curing agent is in a state being reacted with the (meth) acrylic copolymer.

More preferably, for the temporary adhesive layer 3b, it is preferable that 0.5-5.0 pts·mass of the curing agent including an isocyanate group or epoxy group is used for 100 pts·mass of (meth) acrylic copolymer, and at least a part of the curing agent is cross liked. If the amount of the curing agent is less than 0.5 pts·mass, the temporary adhesive may likely to remain. If the amount of the curing agent is more than 5 pts·mass, followability is impaired, which may cause breaking or the like of the wafer during grinding.

As for the above-mentioned radiation polymerizable compound, a low-molecular-weight compound having at least two or more photo polymerizable carbon-carbon double bonds, which can be formed into a three-dimensional network structure by irradiation of radioactive rays, in a molecule is widely used. Specifically, acrylate compounds such as trimethylol propane triacrylate, tetramethylol methane tetraacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexandiol diacrylate, polyethylene glycol diacrylate, or oligoester acrylate can be widely applicable.

Other than the above-mentioned acrylate compounds, urethane acrylate type oligomer can also be used. The urethane acrylate type oligomer can be obtained by reacting terminal isocyanate urethane prepolymer, which can be obtained by reacting a polyester type or polyether type polyol compound with a polyvalent isocyanate compound (for example: 2,4-tolylene diisocyanate, 2,6-tolylene diisocyanate, 1,3-xylene diisocyanate, 1,4-xylene diisocyanate, or diphenyl-methane-4, 4-diisocyanate), with acrylate having a hydroxy group or methacrylate (for example: 2-hydroxyethyl acrylate, 2-hydroxyethyl methacrylate, 2-hydroxypropyl acrylate, 2-hydroxypropyl methacrylate, polyethylene glycol acrylate, polyethylene glycol methacrylate).

A compounding ratio between the acrylic temporary adhesive and the radiation polymerizable compound within the radiation curable temporary adhesive is preferably in a range from 50 to 200 pts·mass, or more preferably from 50 to 150, of the radiation polymerizable compound to 100 pts·mass of the acrylic temporary adhesive. Within this range of the compounding ratio, the temporary adhesive force of the temporary adhesive layer significantly decreases after irradiation of radioactive rays.

As the radiation curable temporary adhesive to be used for the temporary adhesive layer 3a, instead of mixing a radiation curable compound into the acrylic temporary adhesive agent, it is also possible to make the acrylic copolymer itself a radiation polymerizable acrylic acid ester copolymer.

The radiation polymerizable acrylic ester copolymer is a copolymer of which a copolymer molecule includes a functional group that can react and become polymerized when irradiated by radioactive rays, especially ultraviolet rays. As such a reactive group, an ethylenically unsaturated group, that is a group having a carbon-carbon double bond, is preferable. Examples for such a group are: vinyl group, allyl group, styryl group, (meth) acryloyloxy group, and (meth) acryloylamino group. Such reactive group can be obtained by reacting, for example, a copolymer including a hydroxy group in a side chain of a copolymerization polymer with a compound including a group that reacts with the hydroxy group (an isocyanate group, for example) as well as the above-mentioned reactive group that can have a polymerizaion reaction by irradiating ultraviolet rays (representatively, 2-(meth) acryloyloxy ethyl isocyanate).

Introducing the above-mentioned reactive group into the copolymer can be done by using together a photopolymerization initiator, such as isopropyl benzoin ether, isobutyl benzoin ether, benzophenone, Michler's ketone, chlorothioxanthone, benzyl methyl ketal, α-hydroxy cyclohexyl phenyl ketone, 2-hydroxy methyl phenyl propane, or the like. Adding at least one of the above to the temporary adhesive layer allows the polymerizing reaction to progress efficiently.

A temporary adhesive that includes (meth) acrylate compound having a ultraviolet-ray curable carbon-carbon double bond in addition to the acrylic temporary adhesive formed of a copolymer of 2-ethylhexyl acrylate and n-butylacrylate mixed with photoinitiator, photosensitizer, conventionally known tackifier, softening agent, antioxidant, and the like is one of preferable forms. It is also preferable to adopt an embodiment described in Japanese Unexamined Patent Application Publication No. 2014-192204, paragraphs 0036 to 0055 as the temporary adhesive layer 3b.

It is preferable that the temporary adhesive layer 3b includes (meth) acrylic copolymer, which has an ethylenically unsaturated bond in its side chain as a principal component, and a content rate of the (meth) acrylic copolymer and its cross-linked substances is 90% or more. If the content rate is less than 90%, the temporary adhesive layer 3b may be damaged during ashing and the like because chemical resistance and oxidization resistance are insufficient.

Also, a storage elastic modulus of the temporary adhesive layer 3b is preferably between $5.0 \times 10^4$ Pa and $2.0 \times 10^5$ Pa. If the storage elastic modulus is less than $5.0 \times 10^4$ Pa, deformation of the temporary adhesive layer 3b at the time of pasting the mask film as a mask material layer onto the rear surface of the wafer becomes too much that the wafer may break.

A thickness of the temporary adhesive layer 3b is preferably between 5 µm and 100 µm, and more preferably between 5 and 30 µm. If the thickness is less than 5 µm, protection for the elements or the like formed on the pattern surface 2 may be insufficient and, in addition, the adhesiveness is insufficient to cover the roughness of the pattern surface 2 and thus the device may be damaged due to $SF_6$ gas entry. Although it depends on the type of the device, the roughness of the pattern surface 2 is approximately from a few µm to 15 µm. Thus the thickness of the temporary adhesive layer 3b is more preferably between 5 µm to 30 µm.

In addition to the adhesive agent formed of the above-mentioned materials, the temporary adhesive layer 3b can be provided with an anchor layer included in a side of the substrate film 3a. This anchor layer is usually made of an acrylic temporary adhesive including (meth) acrylic copolymer and a curing agent as essential components, and a pressure sensitive temporary adhesive agent is used.

(Mask Tape 11)

The masking tape 11 is required to have a plasma resistance that can withstand during the plasma dicing process. Also, as shown in FIG. 3A, the masking tape 11 is pasted on the flat rear surface B that is on the opposite side of the pattern surface 2 of the semiconductor wafer 1. Thus, for example, compared to pasting on a rough surface such as the pattern surface 2, the followability to the rough shape is unnecessary for the masking tape 11. For this reason, the masking tape 11 having the bending elastic modulus of 200 MPa or higher is also applicable, for example. For such the masking tape 11, polyolefin resin such as polyethylene, polypropylene, or ethylene-acetate vinyl copolymer is applicable.

(Chip Fixing Tape 4)

The chip fixing tape 4 supports the semiconductor wafer 1 and is required to have a good pick-up capability and, in some cases, expandability and the like, in the pick up process. For such the chip fixing tape 4, the same tape as the above surface protection tape 3 can be used. Also, generally called dicing tape, which is commonly known dicing tape used in conventional plasma dicing method, can be used. Also, to make transition to a die bonding process after the pickup process easier, dicing die bonding tape, which is a laminate of die bonding adhesive agent between the temporary adhesive layer 3b and the substrate film 3a can be used.

As described above, the method for producing semiconductor chips according to the present embodiment (the processing method for the semiconductor wafer) includes the steps of pasting the surface protection tape 3 to protect the pattern surface 2, grinding the rear surface B, forming a mask material layer on the rear surface B, opening the streets from the rear surface B side by the laser L, plasma dicing by $SF_6$ plasma 15, and mask ashing by $O_2$ plasma 19. Consequently, it is possible to suppress damages to the device due to excessive ashing, which occurs in the conventional method in which the mask material layer is formed on the side of the pattern surface 2 and removed by ashing using $O_2$ plasma. Thus, it is possible to significantly reduce the loss of expensive chips during the manufacturing processes.

In particular, the substrate film 3a of the surface protection tape 3 has a rigidity that is higher than a predetermined value, and this can prevent warping of the semiconductor wafer 1. Also, appropriately setting the surface roughness and the surface resistivity of the substrate film 3a of the surface protection tape 3 allows an efficient electrostatic chuck and can prevent the conveyance error.

Also, appropriately deciding the components of and cross linking density for the temporary adhesive layer 3b of the surface protection tape 3 can prevent reactions with oxygen and melting or swelling of the temporary adhesive during the ashing process and the like. Furthermore, appropriately setting the storage elastic modulus of the temporary adhesive layer 3b can reduce the amount of deformation of the temporary adhesive layer 3b at the time of pasting the masking tape 11 and the like below the predetermined value, which can prevent cracking of the semiconductor wafer 1.

Also, the mask material layer is formed of the masking tape 11, and thus a photolithography process and the like for providing a photoresist used in the conventional plasma dicing process becomes unnecessary. Also, using the masking tape 11 with high rigidity can prevent the semiconductor wafer 1 from warping and the like.

WORKING EXAMPLES

Hereinafter, the present invention will be described in further detail based on working examples. However, the present invention is not limited to these examples.

1. Evaluation on Transverse Strength of the Semiconductor Chips Produced by the Method Working Example 1

1.0 mol % of methacrylic acid, 78 mol % of 2-ethylhexyl acrylate, and 21 mol % of 2-hydroxy ethyl acrylate are mixed for polymerization in a solution to obtain a polymer solution. 100 pts·mass of this polymer is reacted with 5 pts·mass of 2-methacryloyl oxyethyl isocyanate (product name: Karenz MOI by Showa Denko K.K) having a photo polymerizable carbon-carbon double bond as an oligomer. This reactive polymer is mixed with 5 pts·mass of photopolymerization initiator (product name: Omnirad 184 (former Irgacure184) by IGM Resins B.V.) and 2.5 pts·mass of isocyanate curing agent (product name: Coronate L by Tosoh Corporation) as a crosslinking agent, and its concentration is adjusted by ethyl acetate to obtain a temporary adhesive composition I. The temporary adhesive composition I is then applied on a 38 µm PET separator (product name: #38 Cerapeel WZ (E) by Toray Advanced Film Co., Ltd.) so that a thickness of the temporary adhesive composition I is 40 µm after drying. After being dried in a drying furnace at a temperature of 120° C., a polyethylene terephthalate film (product name: Lumirror S105 by Toray Industries, Inc.) having a thickness of 50 µm is laminated as a substrate film to produce a semiconductor wafer surface protection tape of the Working Example 1.

5 mol % of methyl acrylate, 47 mol % of butyl acrylate, 47 mol % of 2-ethylhexyl acrylate, and 1 mol % of 2-hydroexyethyl acrylate are mixed and polymerized in a solution to obtain a polymer solution. 100 pts·mass of this polymer solution is mixed with 2.0 pts·mass of an epoxy curing agent (product name: Tetrad-C by Mitsubishi Gas Chemical Company, Inc.) to obtain a mask material component I. This mask material component I is then applied on a 38 µm PET separator (product name: #38 Cerapeel WZ (E) by Toray Advanced Film Co., Ltd.) so that a thickness of the mask material composition I is 30 µm after drying. After being dried in a drying furnace at a temperature of 120° C., the mask material component I is pasted onto 25 μm PET separator (product name: Purex™ II SRD by Teijin Film Solutions Ltd.) and laminated to produce a mask material film (masking tape).

The surface protection tape formed as the above is used to in the processes below. First, on a pattern surface side of a silicon wafer having a diameter of 8 inch, the surface protection tape having the same diameter as the wafer is pasted, and the wafer is ground by a back grinder (product name: DGP8760 by DISCO Corporation) until the wafer thickness is 50 μm. Next, the above mask material film is pasted onto the ground rear surface. Then the mask material layer is removed by $CO_2$ laser along parts that correspond to streets of the silicon wafer to open the street parts.

After that, $SF_6$ gas plasma, which is used as plasma generating gas, is irradiated at an etching speed of 0.5 μm/min. from a surface side of the mask material layer to perform plasma dicing and divide the wafer into 5 mm square chips. Next, $O_2$ gas is used as plasma generating gas and ashing is performed at an etching speed of 1.0 μm/min. to remove the mask material layer. After that, a chip fixing tape is pasted on the side of the ashed wafer rear surface side, which is fixed to and supported by a ring frame. Next, the surface protection tape is released and ultraviolet rays are irradiated from the side of the chip fixing tape to reduce temporary adhesive force of the fixing tape. Then the chips are picked up in the pickup process and the transverse strength of each chip is measured.

Comparison Example 1

The surface protection tape formed as in Working Example 1 is used in the processes below. First, on a pattern surface side of a silicon wafer having a diameter of 8 inch, the surface protection tape having the same diameter as the wafer is pasted, and the wafer is ground by a back grinder (product name: DGP8760 by DISCO Corporation) until the wafer thickness is 50 μm. Next, a semiconductor processing tape is pasted on the rear surface side of the wafer, which is then fixed to and supported by the ring frame, and the surface protection tape is released from the wafer surface. After that, the wafer is cut along dividing lines by using a dicing blade in a dual dicer (product name: DFD6400 by DISCO Corporation) and separated into 5 mm square chips. Ultraviolet rays are irradiated from the side of the dicing tape to reduce temporary adhesive force of the dicing tape. The wafer is then divided, by expanding the semiconductor processing tape, into chips, which are picked up in the pickup process, and the transverse strength of each chip is measured.

The 5 mm square chip separated in the processes of Working Example 1 and Comparison Example 1 is mounted on a parallel plate jig for compression tests provided in a tension tester and applied with a compression load at a speed of 1.0 mm/minute from a presser of bend tester (JIS K7171). The transverse strength σ of the chip is calculated by a formula below using the obtained compression load F. The measurement was repeated five times and the average value is taken as the transverse strength.

$$\sigma = 3FL/2bh^2$$

wherein F represents the compression load, L represents a distance between supporting points, b represents a chip width, and h represents a chip thickness.

The results are shown in Table 1.

TABLE 1

|  | Working Example 1 | Comparison Example 1 |
| --- | --- | --- |
| Transverse Strength (MPa) | 976 | 314 |

The transverse strength of the chip after being picked up is measured for Working Example 1 and Comparison Example 1. From Table 1, the results show that the transvers strength of Working Example 1 is three times higher than the transverse strength of Comparison Example 1. Thus, using the production method of the present invention can improve the transverse strength of the chips. This can keep the damages to the semiconductor chip to a minimum and prevent cracking of the chips.

2. Various Evaluations of the Surface Protection Tape

Working Example 2

Aqueous dispersion formed of a mixture of PEDOT-PSS (PEDOT and polyanion polystylene sulfonate) is applied on a polyethylene terephthalate film (product name: Lumirror S105 by Toray Industries, Inc.) having a thickness of 50 μm by gravure coating so that the thickness thereof is 1 μm after drying. After being dried in a drying furnace at a temperature of 120° C., a PET substrate film provided with an antistatic coating is produced.

The temporary adhesive component I is applied on a 38 μm PET separator (product name: #38 Cerapeel WZ (E) by Toray Advanced Film Co., Ltd.) so that a thickness of the temporary adhesive composition I is 40 μm after drying. After being dried in a drying furnace at a temperature of 120° C., the temporary adhesive component I is pasted with a polyethylene terephthalate film, which has a thickness of 51 μm and is provided with the above-mentioned antistatic coating, as a substrate film and laminated to produce a semiconductor wafer surface protection tape of Working Example 2.

Working Example 3

A semiconductor wafer surface protection tape is produced similarly as in Working Example 1 except that the polymer solutions in Working Example 1 are changed to 74 mol % of 2-ethylhexyl acrylate and 25 mol % of 2-hydroxy ethyl acrylate, and 0.5 pts·mass of isocyanate curing agent (product name: Coronate L by Tosoh Corporation) is used as a crosslinking agent.

Working Example 4

A semiconductor wafer surface protection tape is produced similarly as in Working Example 1 except that the polymer solutions in Working Example 1 are changed to 84 mol % of 2-ethylhexyl acrylate and 15 mol % of 2-hydroxy ethyl acrylate, and 5 pts·mass of epoxy curing agent (product name: TETRAD-X by Mitsubishi Gas Chemical Company, Inc.) is used as a crosslinking agent.

Working Example 5

A semiconductor wafer surface protection tape is produced similarly as in Working Example 1 except that the substrate film is changed to a polyethylene naphthalate (PEN) film (product name: Teonex by Teijin Film Solutions Ltd.) having a thickness of 100 μm.

Working Example 6

High density polyethylene (HDPE, product name: Niporon Hard 4010A by Tosoh Corporation) and ethylene-vinyl acetate copolymer (EVA) resin (product name: NIPOFLEX 540 by Tosoh Corporation) including 10% of vinyl acetate are extrusion molded to form substrate film having a thickness ratio of HDPE:EVA=8:2 and a thickness of 150 μm. The temporary adhesive composition I is then applied on a 38 μm PET separator (product name: #38 Cerapeel WZ (E) by Toray Advanced Film Co., Ltd.) so that a thickness of the temporary adhesive composition I is 40 μm after drying. After being dried in a drying furnace at a temperature of 120° C., the temporary adhesive composition I is pasted with the above-mentioned substrate film and laminated to produce a semiconductor wafer surface protection tape of the Working Example 6.

Working Example 7

High density polyethylene (HDPE, product name: Niporon Hard 4010A by Tosoh Corporation) and ethylene-vinyl acetate copolymer (EVA) resin (product name: NIPOFLEX 510 by Tosoh Corporation) including 6% of vinyl acetate are extrusion molded to form substrate film having a thickness ratio of HDPE:EVA=8:2 and a thickness of 150 μm. The temporary adhesive composition I is then applied on a 38 μm PET separator (product name: #38 Cerapeel WZ (E) by Toray Advanced Film Co., Ltd.) so that a thickness of the temporary adhesive composition I is 40 μm after drying. After being dried in a drying furnace at a temperature of 120° C., the temporary adhesive composition I is pasted with the above-mentioned substrate film and laminated to produce a semiconductor wafer surface protection tape of the Working Example 7.

Working Example 8

A semiconductor wafer surface protection tape is produced similarly as in Working Example 1 except that a compounding amount of isocyanate curing agent (product name: Coronate L by Tosoh Corporation) as a crosslinking agent is changed to 10.

Working Example 9

A semiconductor wafer surface protection tape is produced similarly as in Working Example 1 except that the crosslinking agent is changed to an epoxy curing agent (product name: TETRAD-X by Mitsubishi Gas Chemical Company, Inc.) and its compounding amount is changed to 0.3.

Working Example 10

A semiconductor wafer surface protection tape is produced similarly as in Working Example 1 except that the polymer solutions in Working Example 1 are changed to 69 mol % of 2-ethylhexyl acrylate and 30 mol % of 2-hydroxy ethyl acrylate, and 0.1 pts·mass of isocyanate curing agent (product name: Coronate L by Tosoh Corporation) is used as a crosslinking agent.

Working Example 11

High density polyethylene (HDPE, product name: Niporon Hard 4010A by Tosoh Corporation) and ethylene-vinyl acetate copolymer (EVA) resin (product name: NIPOFLEX 636 by Tosoh Corporation) including 19% of vinyl acetate are extrusion molded to form substrate film having a thickness ratio of HDPE:EVA=2:8 and a thickness of 150 μm. The temporary adhesive composition I is then applied on a 38 μm PET separator (product name: #38 Cerapeel WZ (E) by Toray Advanced Film Co., Ltd.) so that a thickness of the temporary adhesive composition I is 40 μm after drying. After being dried in a drying furnace at a temperature of 120° C., the temporary adhesive composition I is pasted with the above-mentioned substrate film and laminated to produce a semiconductor wafer surface protection tape of the Working Example 11.

Working Example 12

Ethylene-vinyl acetate copolymer (EVA) resin (product name: NIPOFLEX 636 by Tosoh Corporation) including 19% of vinyl acetate is extrusion molded to form substrate film having a thickness of 150 μm. The temporary adhesive composition I is then applied on a 38 μm PET separator (product name: #38 Cerapeel WZ (E) by Toray Advanced Film Co., Ltd.) so that a thickness of the temporary adhesive composition I is 40 μm after drying. After being dried in a drying furnace at a temperature of 120° C., the temporary adhesive composition I is pasted with the above-mentioned substrate film and laminated to produce a semiconductor wafer surface protection tape of the Working Example 12.

[Surface Resistivity]

Surface resistivity of a surface of the substrate film of each obtained surface protection tape is measured by applying 500 V of electric voltage under conditions of 23° C. and 50% RH and reading the electric current value 60 seconds after the voltage application. For the measurement, a digital ultra high resistance meter/micro-ammeter (product name: R8340/8340A by Advantest Corporation) and a resistivity chamber (product name: R12702A by Advantest Corporation) are used.

[Content Rate of the Temporary Adhesive]

Each semiconductor wafer surface protection tape is cut into A5 size and released from the separator to be a test piece. Mass of this test piece is measured and the test piece is then soaked in toluene for 24 hours. At this time, the test piece is fixed to a weight or a bottom of a vessel in a direction so that the substrate film is in contact with the weight or the vessel and a paste surface, which is the temporary adhesive layer, is exposed to the toluene solvent. The test piece is taken out thereafter and dried at 50° C. for 24 hours. Also, toluene solvent is collected through a mesh. The test piece and residue on the mesh are measured.

Mass of the substrate film and the mesh is subtracted from the obtained mass. Here, the mass of the residue is measured as it is, and the mass of the substrate film is measured by using a substrate film cut into a piece with the same area as the test piece. With these values, the content rate of the temporary adhesive (the temporary adhesive layer) before radiation curing is calculated from the formula below.

Content Rate (%)={(Total mass of the test piece and the mesh after soaked in toluene)−(mass of the substrate film of the test piece+mass of the mesh)}/(mass of the test piece before soaking in toluene−mass of the substrate film of the test piece)×100

[Storage Elastic Modulus]

The storage elastic modulus of each temporary adhesive layer is measured by using a viscoelasticity measuring apparatus (product name: ARES by TA Instruments Japan Inc.). The measurement is made under conditions such that the measurement begins at a temperature of 0° C. with rising temperature speed of 5° C./min and a frequency of 1 Hz, and the measured value is the value when the temperature reaches 25° C. The test piece used is a laminate of the temporary adhesive layer and is in a cylindrical shape with a thickness of approximately 1 mm and a diameter of 8 mm.

[Chemical Resistivity]

The semiconductor wafer surface protection temporary adhesive tape is pasted on an 8-inch semiconductor wafer, which is then fixed to a ring frame and soaked in methyl isobutyl ketone (MIBK) for an hour. Then, the temporary adhesive layer is observed after spin drying at 20 rpm. Those without melting or swelling of the temporary adhesive are graded as 'good' and those with swelling or melting of the temporary adhesive are graded as 'bad'.

[Wafer Warping]

The semiconductor wafer surface protection temporary adhesive tape of each of the working examples is pasted on an 8-inch semiconductor wafer with a thickness of 725 μm by using a tape applicator (product name: DR8500111 by Nitto Denko Corporation). The wafer is then ground by using a grinder (product name: DGP8760 by Disco Corporation) until the thickness thereof is 50 μm. For each semiconductor wafer surface protection temporary adhesive tape, twenty wafers are ground and an amount of warping (a height of a lower surface of the highest point of the warped wafer from a surface of a flat plate on which the wafer is placed) is measured for the each wafer.

Those having the average warping amount that is less than 10 mm are graded as 'good', those having the average warping amount that is 10 mm or more and less than 20 mm graded as 'average, and those having the average warping amount that is more than 20 mm are graded as 'bad,

[Heat Resistance Test]

The semiconductor wafer surface protection temporary adhesive tape of each of the working examples is pasted on an 8-inch semiconductor wafer with a thickness of 725 μm by using the tape applicator (product name: DR8500111 by Nitto Denko Corporation). The wafer is then left on a hot plate heated at 90° C. for three minutes with its tape surface facing downward. After that, the tape surface is observed by sight.

Those in which the tape surface is not melted are graded as 'good', and those with the softened tape surface are graded as 'bad'.

[Electrostatic Chuck]

The semiconductor wafer surface protection temporary adhesive tape of each of the working examples is pasted on an 8-inch semiconductor wafer with a thickness of 725 μm by using the tape applicator (product name: DR8500111 by Nitto Denko Corporation). The wafer is then ground by using the grinder (product name: DGP8760 by Disco Corporation) until the thickness thereof is 150 μm. For each semiconductor wafer surface protection temporary adhesive tape, twenty wafers are ground. Each wafer is mounted and fixed on an electrostatic chuck apparatus with the above-mentioned surface protected side being inward, and it is checked whether there is a chuck error or not at this time.

Those without chuck errors are graded as 'good', and those with one or more chuck errors are graded as 'average.

[Wafer Cracking]

The semiconductor wafer surface protection temporary adhesive tape of each of the working examples is pasted on an 8-inch semiconductor wafer with a thickness of 725 μm by using the tape applicator (product name: DR8500111 by Nitto Denko Corporation). The wafer is then ground by using the grinder (product name: DGP8760 by Disco Corporation) until the thickness thereof is 50 μm. For each semiconductor wafer surface protection temporary adhesive tape, twenty wafers are ground and states of the wafers after grinding are observed. Also, the states of the wafers at the time of pasting the mask material film produced in Working Example 1 onto the ground rear surfaces are observed, so the wafer cracking in the processes from grinding up to mask material film pasting is observed by sight.

Those without wafer cracking are graded as 'good', and those with one or more wafer cracking are graded as 'bad.

The results are shown in Tables 2 and 3.

TABLE 2

| | | Working Example 2 | Working Example 3 | Working Example 4 | Working Example 5 | Working Example 6 | Working Example 7 |
|---|---|---|---|---|---|---|---|
| Substrate Film | Type | PET | PET | PET | PEN | HDPE/EVA | HDPE/EVA |
| | VA % | — | — | — | — | 10 | 6 |
| | Bending Elastic Modulus [Pa] | $3.0 \times 10^9$ | $3.0 \times 10^9$ | $3.0 \times 10^9$ | $1.0 \times 10^{10}$ | $5.0 \times 10^8$ | $3.0 \times 10^8$ |
| | Melting Point [° C.] | 260 | 260 | 260 | 310 | 130 | 107 |
| | Surface Roughness [Ra] | 0.1 | 0.1 | 0.1 | 0.1 | 2.0 | 1.5 |
| | Surface Resistivity [Ω/□] | $7.0 \times 10^{12}$ | $5.0 \times 10^{15}$ | $5.0 \times 10^{15}$ | $8.0 \times 10^{15}$ | $2.0 \times 10^{16}$ | $3.0 \times 10^{16}$ |
| Temporary Adhesive Layer | Type of Curing Agent | L-45 | L-45 | TETRAD-X | L-45 | L-45 | L-45 |
| | Content Rate [%] | 93 | 91 | 94 | 93 | 93 | 93 |
| | Added Amount [pts. mass] | 2.5 | 0.5 | 5 | 2.5 | 2.5 | 2.5 |
| | Storage Elastic Modulus [Pa] | $5.0 \times 10^4$ | $1.0 \times 10^4$ | $1.0 \times 10^5$ | $5.0 \times 10^4$ | $5.0 \times 10^4$ | $5.0 \times 10^4$ |
| Evaluation Points | Chemical Resistivity | good | good | good | good | good | good |
| | Wafer Warping | good | good | good | good | good | average |
| | Heat Resistance | good | good | good | good | good | good |
| | Electrostatic Chuck | good | average | average | average | average | average |
| | Wafer Cracking | good | good | good | good | good | good |

TABLE 3

| | | Working Example 8 | Working Example 9 | Working Example 10 | Working Example 11 | Working Example 12 |
|---|---|---|---|---|---|---|
| Substrate Film | Type | PET | PET | PET | HDPE/EVA | EVA |
| | VA % | — | — | — | 19 | 19 |
| | Bending Elastic Modulus [Pa] | $3.0 \times 10^9$ | $3.0 \times 10^9$ | $3.0 \times 10^9$ | $7.0 \times 10^7$ | $4.0 \times 10^6$ |
| | Melting Point [° C.] | 260 | 260 | 260 | 87 | 82 |
| | Surface Roughness [Ra] | 0.1 | 0.1 | 0.1 | 1.9 | 3.0 |
| | Surface Resistivity [Ω/□] | $5.0 \times 10^{15}$ | $5.0 \times 10^{15}$ | $5.0 \times 10^{15}$ | $4.0 \times 10^{16}$ | $4.0 \times 10^{16}$ |
| Temporary Adhesive Layer | Type of Curing Agent | L-45 | TETRAD-X | L-45 | L-45 | L-45 |
| | Content Rate [%] | 95 | 90 | 87 | 93 | 93 |
| | Added Amount [pts. mass] | 10 | 0.3 | 0.1 | 2.5 | 2.5 |
| | Storage Elastic Modulus [Pa] | $3.0 \times 10^5$ | $7.0 \times 10^3$ | $5.0 \times 10^3$ | $5.0 \times 10^4$ | $5.0 \times 10^4$ |
| Evaluation Points | Chemical Resistivity | good | good | bad | good | good |
| | Wafer Warping | good | good | good | bad | bad |
| | Heat Resistance | good | good | good | bad | bad |
| | Electrostatic Chuck | average | average | average | average | average |
| | Wafer Cracking | bad | bad | bad | good | good |

Although details will be omitted, similarly to Working Example 1, each of Working Examples 2 to 12 has high transverse strength of the chip, and thus the damages to the semiconductor chip can be suppressed to a minimum. Also, as shown in above Table 2 and Table 3, in Working Examples 2 to 7, the temporary adhesive layer has (meth) acrylic copolymer, which has an ethylenically unsaturated bond on the side chain, as a principal component, the content rate of (meth) acrylic copolymer and its cross linking substance is 90% or more, 0.5-5 pts·mass of the curing agent including an isocyanate group or epoxy group is used for 100 pts·mass of (meth) acrylic copolymer, and at least a part of the curing agent is cross liked. Thus, the surface protection tape can suppress chemical resistivity and wafer cracking at the time of pasting the mask material film produced in Working Example 1.

Also, the bending elastic modulus of the substrate film that forms the surface protection tape is within a range between $5.0 \times 10^8$ Pa and $1.0 \times 10^{10}$ Pa and the melting point of the resin forming the substrate film is 90° C. or higher. This can suppress wafer warping, which leads to an excellent handling property, and can prevent softening of the substrate film due to heat generated during the plasma dicing.

In particular, in Working Example 2, the substrate film with an antistatic coating is used for the surface protection tape, and thus the chuck errors in the electrostatic chuck method can be suppressed with certainty.

In Working Example 8, on the other hand, the amount of the curing agent in the temporary adhesive layer exceeds 5 pts·mass. This deteriorates the wafer surface followability to the pattern surface and results in wafer cracking at the time of grinding the wafer.

In Working Examples 9 and 10, in contrast, the amount of the curing agent in the temporary adhesive layer is less than 0.5 pts·mass. This increases the amount of deformation of the temporary adhesive at the time of pasting the mask material film and causes wafer cracking. In Working Example 10 in particular, the content rate of (meth) acrylic copolymer and its cross linking substances in the temporary adhesive layer is less than 90%, which impairs the chemical resistance and causes melting or swelling of the temporary adhesive.

Also, in Working Examples 11 and 12, the bending elastic modulus of the substrate film that forms the surface protection tape is outside the range between $5.0 \times 10^8$ Pa and $1.0 \times 10^{10}$ Pa. This causes wafer warping, which impairs the handling property and results in the conveyance error. Also, the melting point of the resin forming the substrate film is less than 90° C., and this results in softening of the substrate film under the heat resistant test.

Although the embodiments of the present invention have been described referring to the attached drawings, the technical scope of the present invention is not limited to the embodiments described above. It is obvious that persons skilled in the art can think out various examples of changes or modifications within the scope of the technical idea disclosed in the claims, and it will be understood that they naturally belong to the technical scope of the present invention.

What is claimed is:

1. A method for producing semiconductor chips, the method comprising:

a step a of grinding a rear surface of a semiconductor wafer, the semiconductor wafer comprising a pattern surface on which a surface protection tape is pasted, the surface protection tape comprising at least a substrate film and a temporary adhesive layer, and the rear surface being ground with a surface protection tape being pasted;

a step b of forming a mask material layer on the rear surface of the semiconductor wafer after the rear surface is ground with the surface protection tape being pasted;

a step c of cutting parts that correspond to streets of the semiconductor wafer to open the streets from a side of the mask material layer of the semiconductor wafer;

a step d of plasma dicing in which $SF_6$ plasma divides and separates the semiconductor wafer at the streets into individual semiconductor chips;

a step e of ashing in which $O_2$ plasma removes the mask material layer;

a step f of pasting a chip fixing tape to the rear surface of the semiconductor wafer after ashing, and fixing the semiconductor wafer to a ring frame to be supported; and a step g of releasing the surface protection tape, wherein a surface resistivity of the surface of the substrate film where the temporary adhesive layer is not formed is greater than $10^{12}$ Ω/sq and less than $10^{13}$ Ω/sq.

2. The method for producing semiconductor chips according to claim 1, wherein the temporary adhesive layer comprises (meth) acrylic copolymer, which has an ethylenically unsaturated bond in a side chain as a principal component, and a content rate of the (meth) acrylic copolymer and cross-linked substances of the (meth) acrylic copolymer is 90% or more.

3. The method for producing semiconductor chips according to claim 1, wherein in the temporary adhesive layer, 0.5-5.0 pts·mass of a curing agent including an isocyanate group or epoxy group is used for 100 pts·mass of (meth) acrylic copolymer, and at least a part of the curing agent is cross liked.

4. The method for producing semiconductor chips according to claim 1, wherein a bending elastic modulus of the substrate film is between $5.0 \times 10^8$ Pa and $1.0 \times 10^{10}$ Pa.

5. The method for producing semiconductor chips according to claim 1, wherein a melting point of a resin forming the substrate film is 90° C. or higher.

6. The method for producing semiconductor chips according to claim 1, wherein a surface roughness Ra of a surface of the substrate film where the temporary adhesive layer is not formed is between 0.1 μm and 2.0 μm.

7. The method for producing semiconductor chips according to claim 1, wherein a storage elastic modulus of the temporary adhesive layer is between $5.0 \times 10^4$ Pa and $2.0 \times 10^5$ Pa.

8. The method for producing semiconductor chips according to claim 1, wherein in the step g, ultraviolet rays are irradiated onto the surface protection tape to cure the temporary adhesive layer, weaken an adhesive force of the temporary adhesive layer, and make an adhesive force between the semiconductor chips and the chip fixing tape and an adhesive force between the substrate film and the temporary adhesive layer stronger than an adhesive force between the temporary adhesive layer and the semiconductor chips, and then the surface protection tape is released.

9. The method for producing semiconductor chips according to claim 1, wherein the temporary adhesive layer is provided with an anchor layer included in a side of the substrate film.

\* \* \* \* \*